(12) United States Patent
Kumar et al.

(10) Patent No.: US 10,949,738 B1
(45) Date of Patent: Mar. 16, 2021

(54) TUNABLE MEMRISTOR NOISE CONTROL

(71) Applicant: Hewlett Packard Enterprise Development LP, Houston, TX (US)

(72) Inventors: Suhas Kumar, Palo Alto, CA (US); John Paul Strachan, Palo Alto, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 16/593,391

(22) Filed: Oct. 4, 2019

(51) Int. Cl.
| | | |
|---|---|---|
| *G11C 11/00* | (2006.01) | |
| *G06N 3/063* | (2006.01) | |
| *G11C 13/00* | (2006.01) | |
| *G06N 3/04* | (2006.01) | |
| *G11C 11/54* | (2006.01) | |

(52) U.S. Cl.
CPC .......... *G06N 3/063* (2013.01); *G06N 3/0445* (2013.01); *G11C 11/54* (2013.01); *G11C 13/0033* (2013.01); *G11C 13/0061* (2013.01)

(58) Field of Classification Search
CPC . G11C 11/54; G11C 13/0033; G11C 13/0061; G06N 3/063; G06N 3/0445
See application file for complete search history.

(56) References Cited

U.S. PATENT DOCUMENTS

| | | | | |
|---|---|---|---|---|
| 6,198,677 | B1 * | 3/2001 | Hsu ........................ | G11C 7/06 365/203 |
| 8,611,134 | B2 * | 12/2013 | Carter .................. | G11C 13/004 365/148 |
| 2014/0028347 | A1 * | 1/2014 | Robinett .......... | H03K 19/17712 326/38 |
| 2020/0193300 | A1 * | 6/2020 | Kumar .................... | G11C 11/54 |

* cited by examiner

*Primary Examiner* — Pho M Luu
(74) *Attorney, Agent, or Firm* — Hewlett Packard Enterprise Department

(57) ABSTRACT

A memristor matrix comprising a crossbar array, a multiplexer and a noise control circuit. The noise control circuit may comprise a threshold comparator and a threshold feedback circuit to receive a first threshold and a second threshold and output a threshold signal based, in part, on an output of the threshold comparator.

19 Claims, 4 Drawing Sheets

TUNABLE MEMRISTOR NOISE CONTROL

BACKGROUND

Certain mathematical problems are difficult to solve computationally when the scale of the problem is increased. For example, a class of mathematical problems called non-deterministic polynomial (NP)-hard often require thousands to millions of years of computational processing time on current technology to come to a deterministic best answer to a problem that is of a commercially useful scale. Heuristic algorithms can determine solutions to NP-hard problems in a more reasonable amount of time (seconds to minutes), but the determined solutions are not guaranteed to be the ideal solution to the problem.

One such heuristic algorithm is a Hopfield neural network (HNN). Neurons in the HNN are interconnected in a complete undirected graph topology. Symmetric connections between the neurons are weighted, and the output value of a certain neuron i is fed back into other neurons of the HNN, including neuron j. For example, if the output of neuron i is +1 and the weight of connection i,j is +0.5, neuron j receives +0.5 as an input from connection i,j. As the network updates, outputs of each neuron are calculated based on comparison between a sum of inputs to the respective neuron and a threshold value.

With each update cycle of the HNN, the network has an energy, which is a value corresponding to the ideality of the solution of the mathematical problem as represented by the current state of the HNN. A HNN in a high-energy state is less ideally solved than a HNN in a low-energy state. The HNN transits across its energy landscape, reducing the energy until the network finds a minimum of the energy landscape. However, energy landscapes are not usually simple functions, such as a linear "vee" functions. Often, the complex functions of the energy landscape include local minima where the HNN may converge without further intervention.

BRIEF DESCRIPTION OF THE DRAWINGS

For a more complete understanding of the present disclosure, examples in accordance with the various features described herein may be more readily understood with reference to the following detailed description taken in conjunction with the accompanying drawings, where like reference numerals designate like structural elements, and in which.

Figure 1:
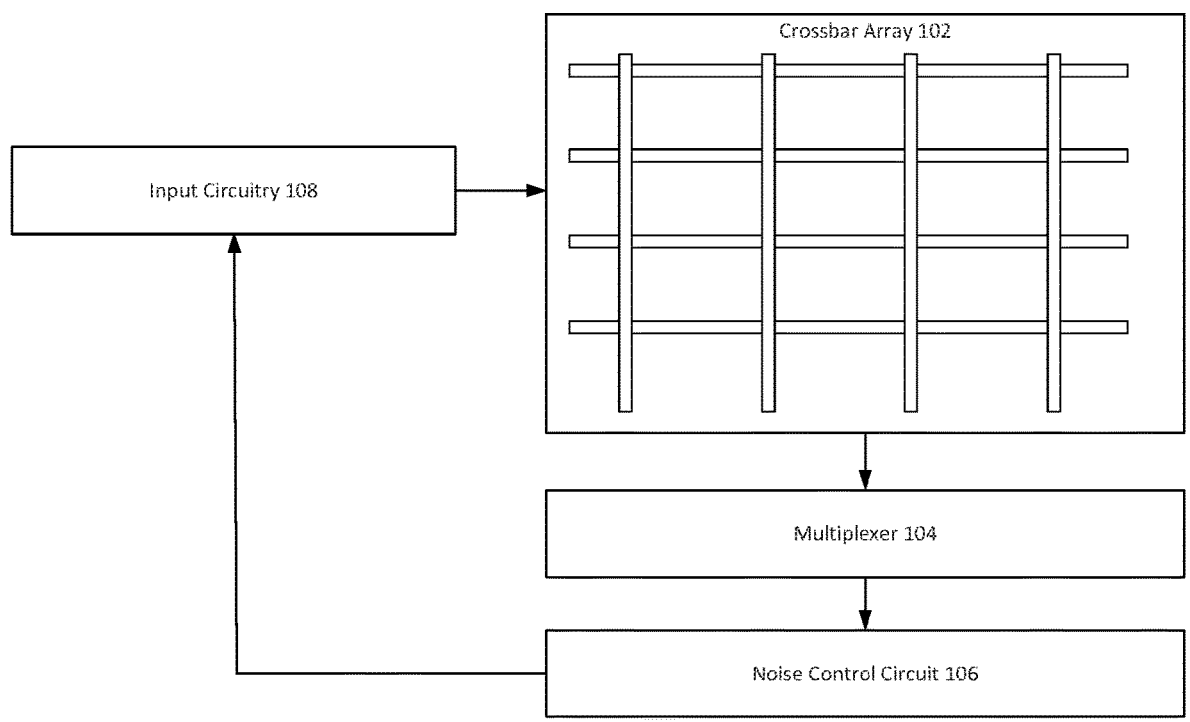
FIG. 1 illustrates an example circuit executing a Hopfield neural network.

Certain examples have features that are in addition to or in lieu of the features illustrated in the above-referenced figures. Certain labels may be omitted from certain figures for the sake of clarity.

DETAILED DESCRIPTION

Efficient resolution of NP-Hard mathematical problems is a holy grail of computing. The commercial applications of NP-Hard solvers encompass logistics from the nano scale (routing vias in an integrated circuit) to the macro scale (routing package carrier aircraft to deliver goods around the globe), and beyond. The current generation of computing equipment is still woefully underpowered to deterministically solve commercially useful NP-Hard mathematical problems within a person's lifetime. Instead, such problems are solved non-deterministically using a number of different types of algorithms.

One such algorithm is a Hopfield neural network (HNN). An HNN can be used to iteratively arrive at improved solutions to the problem. However, one limitation of HNNs is that they are only guaranteed to select the ideal solution when the energy landscape of the HNN monotonically decreases to the global minimum of the energy function from both sides. Otherwise, the HNN may converge to a solution that represents a local minimum on the energy function, but is not the ideal solution to the problem. In digital circuitry, a known method for reducing the likelihood of converging on a local minimum is to generate a random number and input that random number into the neurons of the HNN. This "simulated annealing" attempts to motivate the HNN to pass over local minima in search of the global minimum. However, simulated annealing adds complexity to the circuitry and makes such HNNs less desirable than other algorithms for non-deterministic solutions of NP-Hard problems.

An alternative circuit for solving NP-Hard problems using a HNN is a hybrid analog-digital circuit including a crossbar array of memristors. A memristor crossbar array is a two-dimensional grid of column and row conductors wherein each overlap between a row conductor and a column conductor is electrically coupled via a memristor. In some examples, row conductors conduct input signals to the memristors and column conductors conduct output signals from the memristors. In some examples, a neuron of the HNN is represented by one or more memristors of the crossbar array. When the HNN updates, digital circuitry reads outputs from the crossbar array and generates new inputs for the crossbar array. Like the digital circuit, the hybrid analog-digital circuit is susceptible to converging on local minima of the HNN energy landscape without stochastic input.

Memristors, by virtue of not being digital devices, can induce intrinsic noise into a hybrid analog-digital HNN for solving NP-Hard problems. However, noise is due to non-idealities in the circuit, and thus cannot be finely tuned through design of the circuit. Too little noise will not prevent the HNN from converging on local minima, and too much noise will prevent the HNN from converging at all. Noise control circuitry is used to adjust the amount of noise output from the crossbar array to within a range of acceptable noise for input into the neurons of the HNN.

In some examples, the noise control circuitry is a digital circuit that uses a hysteretic threshold function to ensure the noise is within an acceptable range. For example, the hysteretic width w of the hysteretic threshold function may be adjustable by the noise control circuitry. A negative hysteretic width w amplifies the intrinsic noise of the circuit, while a positive hysteretic width reduces the intrinsic noise of the circuit. In certain examples, the noise control circuitry may include comparators, D latches, and transmission gates. Adjusted noise is then fed into the inputs of the HNN during the next update cycle via additional digital circuitry.

FIG. 1 illustrates an example circuit executing a Hopfield neural network (HNN). Circuit 100 may be a hybrid analog-digital circuit, including a crossbar array 102, multiplexor 104, filter 106, and input circuitry 108. Circuit 100 may also be known as a memristor matrix. In some examples, crossbar array 102 is a two-dimensional array of conductive elements organized as rows and columns. Where a row and a column overlap, they are electrically coupled by a memristor. Although a crossbar array 102 may include any number of rows and columns, certain practical thresholds may exist beyond which performance of the HNN degrades. Potential scaling solutions include modifying memristor density, altering the chemistry or layout of the memristors, tiling multiple crossbar arrays 102, and other known scaling processes.

Crossbar array 102 includes memristors that are elements of neurons of the HNN. In some examples, each memristor represents a neuron. In some other examples, subsets of the memristors of crossbar array 102 represent a neuron. Each conductive element (whether a row element or a column element) addresses a certain number of memristors (the memristors on the row or column). The crossbar array 102 may include multiple inputs and outputs. In some examples, the rows of the crossbar array 102 are electrically coupled to inputs and the columns of the crossbar array 102 are electrically coupled to outputs. In certain examples, certain sections of the crossbar array 102 may include portions or the entirety of one or more of multiplexor 104, noise control circuit 106, and input circuitry 108 implemented in memristor logic. In an example, all rows are driven by a driver of input circuitry 108 to set a new value (or state) for the memristors. In some examples, this parallel driving of the rows mathematically updates the values of the neurons based on vector-matrix multiplication. Specifically, the update value for a row of neurons may be determined based on the following equation:

$$u_i = \sum_{j \neq i} W_{ij} v_j$$

which determines an aggregated input ($u_i$) to a selected neuron based on a sum of output values of other neurons ($v_j$) multiplied by weights of the connection between the selected neuron and the respective other neurons ($W_{ij}$). One characteristic of HNNs is that there is no self-feedback, thus the selected neuron is not in the set of other neurons.

The output of a neuron is determined based on a threshold function. In some examples, the neurons are binary, and the output of a neuron is governed by the following equation:

$$v_i = \begin{cases} +1 & \text{if } (u_i + \eta_i) \geq \theta_i \\ -1 & \text{if } (u_i + \eta_i) < \theta_i \end{cases}$$

where the output of the neuron ($v_i$) is a binary value of +1 if the sum of the input to the neuron ($u_i$) and the inherent noise ($\eta_i$) at the neuron is greater than or equal to a threshold of the neuron ($\theta_i$). If the sum is less than the threshold, the output is −1.

The outputs of the crossbar array 102 are selected by multiplexor 104. In some examples, outputs can be read simultaneously from each output. However, in certain examples, the HNN requires the outputs to be read out of the crossbar array 102 by multiplexor 104 asynchronously to preserve the minimum-seeking behavior of the HNN on its energy landscape.

Multiplexor 104 forwards the output of neurons to noise control circuit 106. Noise control circuit 106 may include a threshold comparator and a threshold feedback circuit. Noise control circuit 106 may be a negatively hysteretic circuit, wherein when an inherently noisy input is received, the noise is either amplified or reduced depending on whether the input exceeds a threshold or not.

In some examples, noise control circuit 106 includes a threshold comparator and a threshold feedback circuit. The threshold feedback circuit may receive a first threshold and a second threshold and output a threshold signal to the threshold comparator. The output threshold signal may correspond to a hysteretic width of the noise control circuit 106. The threshold feedback circuit may determine the threshold based on an output of the threshold comparator. In some examples, the output of the threshold comparator is a noise controlled output of a selected neuron. The threshold feedback circuit may, in determining that there is insufficient intrinsic noise to properly operate the HNN, adjust the threshold more negative to amplify the noise on the output signal. Similarly, the threshold feedback circuit may, in determining that there is too much intrinsic noise to properly operate the HNN, adjust the threshold more positive to reduce the noise on the output signal. In some examples, the appropriate amount of noise on the output signal may change as the HNN progresses through multiple update cycles. For example, the appropriate amount of noise during early updates of the HNN may be greater than the appropriate amount of noise during later updates of the HNN. In certain examples, the hysteretic width of the HNN may be any of positive, negative, or zero.

In some examples, the threshold feedback circuit includes a first and second D latch, a second comparator, and a threshold determination circuit comprising an electronic switch. The first D latch receives an output of the noise control circuit and outputs a first intermediate output and a second intermediate output. In certain examples, the secondary intermediate output is the binary opposite of the first intermediate output. The second comparator receives the first and second intermediate outputs and outputs a third intermediate output to the second D latch. The second D latch then outputs a first control signal and a second control signal to the threshold determination circuit. In certain examples, the first control signal is the binary opposite of the second control signal.

In some examples, the threshold determination circuit includes two transmission gates configured as an electronic switch to switch between the first threshold and the second threshold. In certain other examples, the threshold signal output by the threshold determination circuit is a voltage between the first threshold and the second threshold. In some examples, the threshold determination circuit is controlled by the first and second control signal. The threshold determination circuit receives a first and second threshold as inputs and outputs a threshold signal to the threshold comparator. This noise control circuit 106 may, for input signals without enough intrinsic noise to properly operate the HNN, amplify the intrinsic noise in the output signal.

In some examples, the threshold comparator receives an input signal of an output crossbar of the crossbar array via multiplexor 104 and compares the received inputs signal to the threshold signal received from the threshold determination circuit. The threshold comparator then sends an output signal based on the comparison.

The output signal is then received at input circuitry 108. Input circuitry 108 may include I/O buffers, crossbar drivers, and logic for determining input signals to specific crossbars.

In some examples, a number of row input crossbars is the same as a number of column output crossbars, and the I/O buffers retain the asynchronously received outputs of each column output crossbars in a buffer associated with a respective row input crossbar. Then, once all outputs are received, all row input crossbars may be driven simultaneously in correspondence with the input vector stored in the I/O buffer for performing vector-matrix multiplication across the crossbar array.

Figure 2:
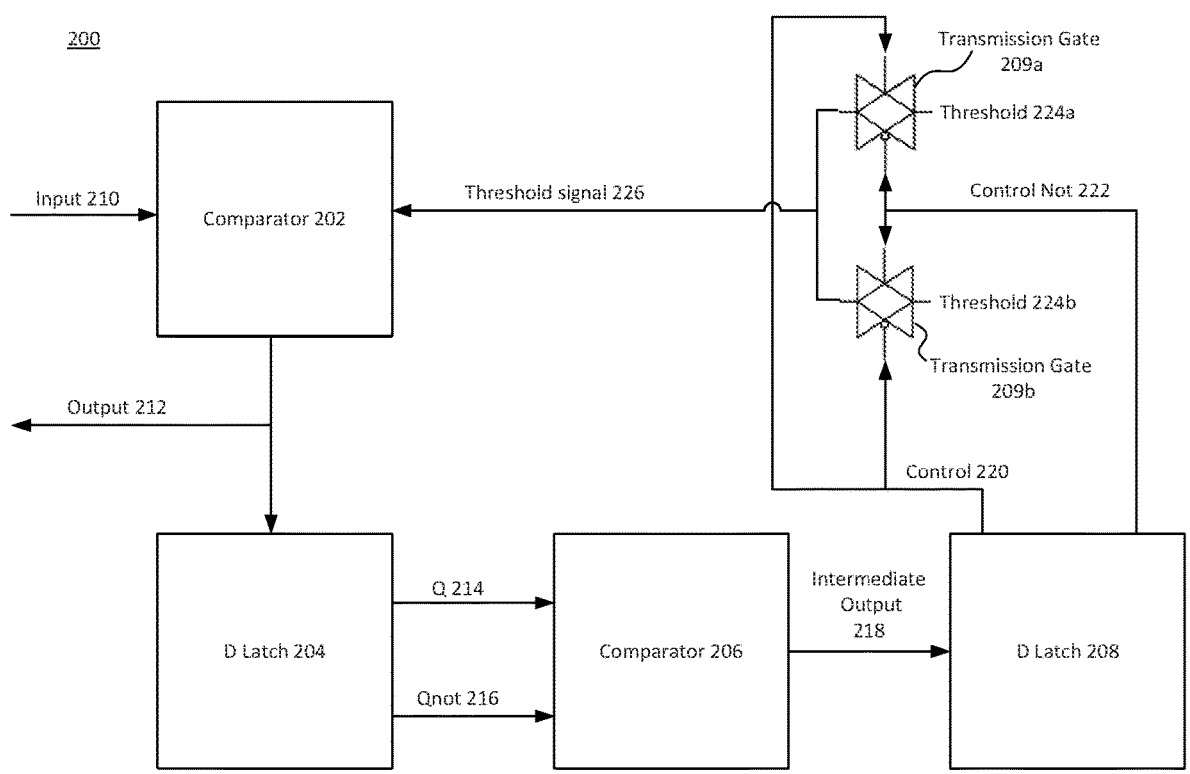
FIG. 2 illustrates an example noise control circuit.

FIG. 2 illustrates an example noise control circuit. Noise control circuit 200 includes comparator 202, D latch 204, comparator 206, D latch 208, and transmission gates 209. Noise control circuit 200 may be a tunable hysteretic feedback circuit. In certain examples, noise control circuit 200 is a negatively hysteretic circuit. Noise control circuit 200 may receive input 210 from a crossbar array via a multiplexor. The crossbar array may be a two dimensional array of memristors electrically cross-coupled via crossbars, and the multiplexor may select a crossbar of the crossbars from which input 210 is input to noise control circuit 200. Output 212 may be fed back into the crossbar array via input circuitry. The input circuitry may include buffers and drivers.

In some examples, comparator 202 compares an input 210 (from a memristor matrix) to a threshold signal and outputs a first output 212. D latch 204 receives the first output 212 and sends a first intermediate output Q 214 and a second intermediate output Qnot 216. In some examples, Qnot 216 is the binary opposite of Q 214. Comparator 206 then compares Q 214 to Qnot 216 and outputs a third intermediate output 218. The second D latch 208 receives intermediate output 218 and outputs a first control signal 220 and a second control signal control not 222.

A threshold determination circuit including transmission gates 209a and 209b receive control signal 220 and control not 222, as well as thresholds 224a and 224b, respectively. In some examples, transmission gates 209a and 209b are configured as an electronic switch. In such examples, threshold signal 226 may be the same value as threshold 224a or threshold 224b depending on the configuration of control signal 220 and control not 222. In some other examples, threshold signal 226 is a voltage between the value of threshold 224a and threshold 224b. Dependent on the values of control signal 220 and control not 222, the threshold determination circuit outputs threshold signal 226 to comparator 202.

Three example operations of noise control circuit 200 follow. Examples 1 and 2 exhibit negative hysteresis, and example 3 exhibits positive hysteresis.

EXAMPLE 1

Suppose that at an initial point of time, input 210 is 0.4 volts, threshold 224a is 0.8 volts, threshold 224b is 0.2 volts, and the initial value of intermediate output 218 is 1 volt.

At the first clock cycle, control signal 220 is 1 V, thus causing threshold signal 226 to be the same as threshold 224a, which is 0.8 V. Since input 210 (at 0.4 V) is less than threshold signal 226 (at 0.8 V), comparator 202 sets output 212 at 0 V.

At the second clock cycle, control signal 220 is 0 V, thus causing threshold signal 226 to be the same as threshold 224b, which is 0.2 V. Since input 210 (at 0.4 V) is greater than threshold signal 226 (at 0.2 V), comparator 202 sets output 212 at 1 V. While input 210 is held at 0.4 V, output 212 toggles between 0 V and 1 V after each clock cycle.

EXAMPLE 2

Suppose that at an initial point of time, input 210 is 0.9 volts, threshold 224a is 0.8 volts, threshold 224b is 0.2 volts, and the initial value of intermediate output 218 is 1 volt.

At the first clock cycle, control signal 220 is 1 V, thus causing threshold signal 226 to be the same as threshold 224a, which is 0.8 V. Since input 210 (at 0.9 V) is greater than threshold signal 226 (at 0.8 V), comparator 202 sets output 212 at 1 V.

At the second clock cycle, control signal 220 is 1 V, thus causing threshold signal 226 to be the same as threshold 224a, which is 0.8 V. Since input 210 (at 0.9 V) is greater than threshold signal 226 (at 0.8 V), comparator 202 sets output 212 at 1 V. While input 210 is held at 0.9 V, output 212 stays at 1 V after each clock cycle.

EXAMPLE 3

Suppose that at an initial point of time, input 210 is 0.4 volts, threshold 224a is 0.2 volts, threshold 224b is 0.8 volts, and the initial value of intermediate output 218 is 1 volt.

At the first clock cycle, control signal 220 is 1 V, thus causing threshold signal 226 to be the same as threshold 224a, which is 0.2 V. Since input 210 (at 0.4 V) is greater than threshold signal 226 (at 0.2 V), comparator 202 sets output 212 at 1 V.

At the second clock cycle, control signal 220 is 1 V, thus causing threshold signal 226 to be the same as threshold 224a, which is 0.2 V. Since input 210 (at 0.4 V) is greater than threshold signal 226 (at 0.2 V), comparator 202 sets output 212 at 1 V. While input 210 is held at 0.4 V, output 212 stays at 1 V after each clock cycle.

In the positively hysteretic example 3, in order for the signal to change from the "top curve" of the hysteresis loop, as represented by threshold 224a, input 210 would have to drop below threshold 224a, outside of the hysteresis loop. In such an occurrence, control signal 220 would switch to 0 V, and input 210 would be compared to threshold 224b until input 210 went above threshold 224b again.

Figure 3A:
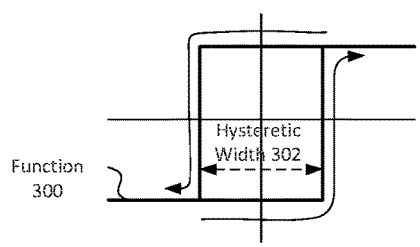
FIG. 3A illustrates an example signal exhibiting positive hysteresis.
Figure 3B:
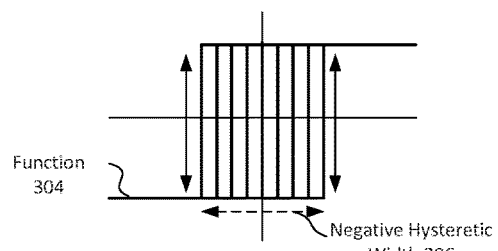
FIG. 3B illustrates an example signal exhibiting negative hysteresis.
Figure 3C:
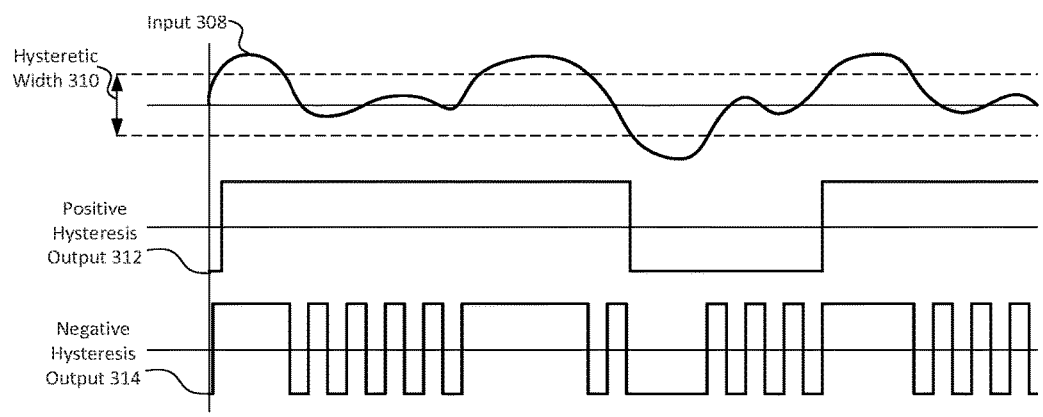
FIG. 3C illustrates a signal graph including an example input signal, an example resultant positive hysteresis output, and an example resultant negative hysteresis output.

FIGS. 3 are signal charts describing operation of circuits exhibiting hysteresis, such as noise control circuit 200. FIG. 3A is a function of a system exhibiting positive hysteresis. Function 300 has a hysteresis loop of a hysteretic width 302. FIG. 3B is a function of a system exhibiting negative hysteresis. Function 304 has a hysteresis loop of a negative hysteretic width 306. FIG. 3C is a signal chart showing an input signal 308, a hysteretic width 310, an output when hysteretic width 310 is positive, positive hysteresis output 312, and an output when hysteretic width 310 is negative, negative hysteresis output 314.

As shown in FIG. 3A, when an input signal to a positively hysteretic system, such as noise control circuit 200 when threshold 224b is greater than threshold 224a, the output exhibits hysteresis. As an input voltage increases (represented by moving from left to right on FIG. 3A), the output signal follows the bottom hysteresis curve, as shown by an arrow. While in the hysteresis loop, represented by the signal within hysteretic width 302, the input voltage may vary within the hysteretic range without ceasing to follow the bottom hysteresis curve. However, if the input voltage grows larger than the hysteretic range (moves further right on FIG.

3A) and then decreases (moving right to left on FIG. 3A), the output voltage will follow the top hysteresis curve as shown by another arrow.

As shown in FIG. 3B, when an input signal to a negatively hysteretic system, such as noise control circuit 200 when threshold 224a is greater than threshold 224b, the output exhibits hysteresis. As an input voltage increases (represented by moving from left to right on FIG. 3B), the output signal toggles between values with each clock cycle while in the hysteresis loop, as shown by the vertical arrows. While in the hysteresis loop, represented by the signal within negative hysteretic width 306, no matter how the input voltage may vary within the hysteretic range the output signal will toggle. However, if the input voltage grows larger than the hysteretic range (moves further right on FIG. 3B) the output voltage will remain at a high value, and if the input voltage reduces to less than the hysteretic range (moves further left of FIG. 3B), the output voltage will remain at a low value.

As shown in FIG. 3C, an input signal 308 varies in an analog manner, as may be expected for an analog signal or a noisy digital signal. At certain times on the signal chart, input signal 308 exceeds the bounds of the hysteretic range, represented by hysteretic width 310. FIG. 3C can be conceptualized as a deconstruction of FIGS. 3A and 3B over a time-axis. The amplitude of the signal input 308 represents a horizontal position on FIGS. 3A and 3B at a certain time. The amplitude of positive hysteresis output 312 represents a vertical position on FIG. 3A at a certain time given the amplitude of input 308, and the amplitude of negative hysteresis output 314 represents a vertical position on FIG. 3B at a certain time given the amplitude of input 308. Positive hysteresis output 312 does not toggle unless one of two conditions is satisfied. Either positive hysteresis output 312 is a low value and input 308 crosses the high threshold of the hysteretic range, or positive hysteresis output 312 is a high value and input 308 crosses the low threshold of the hysteretic range. Negative hysteresis output 312 does not cease to toggle unless input 308 goes outside of the hysteretic range. If input 308 exceeds the high threshold of the hysteretic range, negative hysteresis output 312 stabilizes at a high value. If input 308 is less than the low threshold of the hysteretic range, negative hysteresis output 312 stabilizes at a low value.

Figure 4:
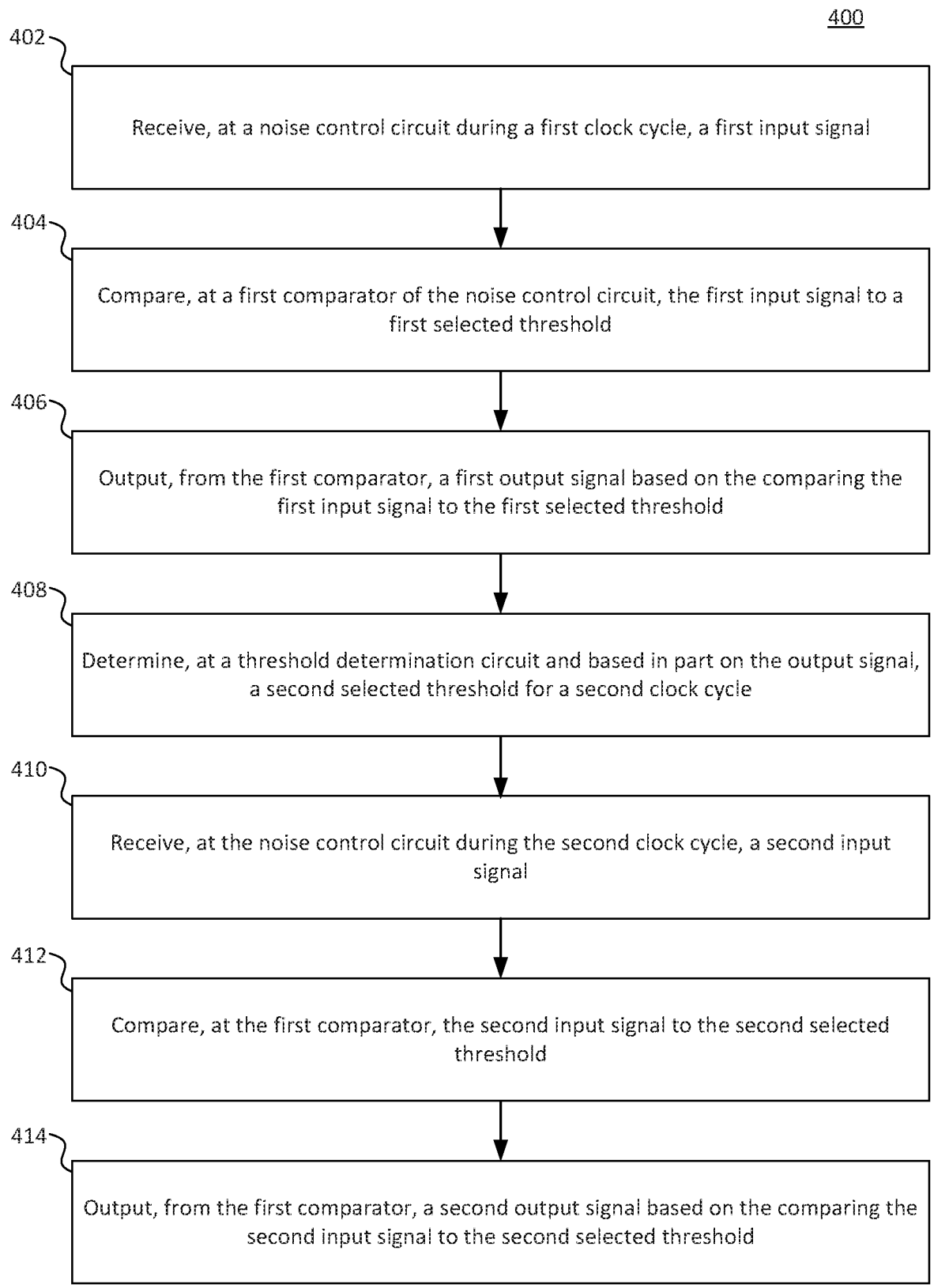
FIG. 4 is a flowchart illustrating an example method to control noise in a circuit executing a Hopfield neural network.

FIG. 4 is a flowchart illustrating an example method to control noise in a circuit executing a Hopfield neural network. In some examples, method 400 is executed by a memristor matrix circuit, such as the example circuit described in FIG. 1.

In block 402, a first input signal is received at a noise control circuit during a first clock cycle. In some examples, the noise circuit is a negatively hysteretic circuit. In some other examples, the noise circuit is a tunable circuit in which a hysteretic width can be tuned to be positive, negative, or zero. In certain examples, the first input signal is a signal of a crossbar array and is received via a multiplexor. The crossbar array may be a two dimensional array of memristors electrically cross-coupled via crossbars. The multiplexor may select a crossbar of the crossbars from which the signal is input into the noise control circuit.

In block 404, the first input signal is compared to a first selected threshold at a first comparator of the noise control circuit. In some examples, the comparison is completed using a digital comparator, which outputs a binary signal to indicate a result of the comparison.

In block 406, a first output signal is output from the first comparator based on comparing the first input signal to the first selected threshold in block 404. In some examples, the first output signal is fed back to the crossbar array via input circuitry.

In block 408, a second selected threshold for a second clock cycle is determined at a threshold determination circuit based, in part on the first output signal. In some examples, the first output signal is input to a D latch, which provides inputs to a comparator, which provides inputs to another D latch, which sends control signals to a threshold determination circuit. In certain examples, the threshold determination circuit selects the second selected threshold based on the control signals. The threshold determination circuit may include a first transmission gate and a second transmission gate configured as an electronic switch to switch between a first threshold and a second threshold. In some other examples, the threshold signal output from the threshold determination circuit is a voltage between the voltage of the first threshold and the voltage of the second threshold.

In block 410, a second input signal is received at the noise control circuit during the second clock cycle. The second input signal may be selected by the multiplexor from a different crossbar of the crossbar array.

In block 412, the second input signal is compared to the second selected threshold at the first comparator. In some examples, the second selected threshold may be the same value as the first selected threshold. In some other examples, the second selected threshold may be a different value than the first selected threshold.

In block 414, a second output signal is output from the first comparator based on the comparing the second input signal to the second selected threshold. In some examples, the first output signal is fed back to the crossbar array via input circuitry.

A Hopfield neural network (HNN) is a recurrent neural network algorithm including cross-connected neurons. Neurons receive inputs (either from other circuitry or from outputs of neurons) and determine an output based on the following equation:

$$u_i = \sum_{j \neq i} W_{ij} v_j,$$

$$v_i = \begin{cases} +1 & \text{if } (u_i + \eta_i) \geq \theta_i \\ -1 & \text{if } (u_i + \eta_i) < \theta_i \end{cases}$$

where v is the state of the neuron, u is weighted feedback accumulated at the neurons at the next time step, W is a zero-diagonal symmetric weights matrix, $\theta_i$ is a threshold and the vector η represents noise from hardware nodes. The binary threshold function serves as an activation function, which essentially implements a nonlinear filter to process the recurrent weighted feedback. Due to symmetry in weight across connections ($W_{ij}=W_{ji}$), a HNN that is asynchronously updated reduces the function that defines its energy landscape (the "energy function") with each update when η=0 (when there is no noise induced in the system). The following equation is an example energy function for a HNN:

$$E = -\frac{1}{2}\sum_{i,j}^{N} W_{ij} v_i v_j + \sum_{i}^{N} \theta_i v_i$$

Since the energy function may not be monotonic, a noiseless HNN solving an NP-hard problem may converge on a solution that is represented as a local minimum of the energy function, rather than the ideal solution, which is represented as a global minimum of the energy function.

A neuron is an algorithmic structure that receives one or more weighted inputs, aggregates the weighted inputs (often through summation) and inputs the aggregated input into a transfer function. The transfer function compares the aggregated input to a threshold and outputs a result of the comparison. In some examples, the output of a neuron is binary.

Hysteresis is a property of a mathematical function where the behavior of the function depends on the history of the system implementing the function. Certain hysteretic systems exhibit hysteresis in a certain range of input values (i.e. the hysteresis loop), and do not exhibit hysteresis outside of that certain range. The magnitude of the range can be referred to as the hysteretic width. Often, in practical electrical systems with positive hysteresis, the output of the system conforms to a first curve of the hysteresis loop as long as the input to the system is within the hysteretic range. However, when the input to the system crosses a hysteretic threshold (either end of the hysteresis loop), the output toggles to conform to a second curve of the hysteresis loop. The system can be considered relatively stable while the input is within the hysteretic range, and toggling between states when the input crosses a hysteretic threshold. However, with a negatively hysteretic system (as described in this disclosure), the opposite is true, the system is relatively stable when the input is outside of the hysteretic range, and toggles when the input is within the hysteretic range.

A memristor is an electronic component that exhibits variable resistance based on a history of current through the device. While there are many theoretical and prototypical types of memristor, one type of memristor is a tantalum oxide memristor. In a tantalum oxide memristor, doped layers of a tantalum oxide are sandwiched between conductors. Certain layers may be doped more strongly with oxygen and other impurities than others. The memristor may store an input and read a state based on an input voltage. Generally, large voltages (positive or negative) store an input and small voltages allow the state of the memristor to be read.

The features of the present disclosure can be implemented using a variety of specific devices that contain a variety of different technologies and characteristics. As would be clear to a person having ordinary skill in the art, the features of the present disclosure are not altered by the technology, whether known or as yet unknown, and the characteristics of specific devices the features are implemented on. Any modifications or alterations that would be required to implement the features of the present disclosure on a specific device or in a specific example would be obvious to a person having ordinary skill in the relevant art.

Although the present disclosure has been described in detail, it should be understood that various changes, substitutions and alterations can be made without departing from the spirit and scope of the disclosure. Any use of the words "may" or "can" in respect to features of the disclosure indicates that certain examples include the feature and certain other examples do not include the feature, as is appropriate given the context. Any use of the words "or" and "and" in respect to features of the disclosure indicates that examples can contain any combination of the listed features, as is appropriate given the context.

Phrases and parentheticals beginning with "e.g." or "i.e." are used to provide examples merely for the purpose of clarity. It is not intended that the disclosure be limited by the examples provided in these phrases and parentheticals. The scope and understanding of this disclosure may include certain examples that are not disclosed in such phrases and parentheticals.

The invention claimed is:

1. A memristor matrix, comprising:
   a crossbar array;
   a multiplexer; and
   a noise control circuit, comprising:
      a threshold comparator; and
      a threshold feedback circuit to receive a first threshold and a second threshold and output a threshold signal based, in part, on an output of the threshold comparator, the threshold feedback circuit comprising:
         a first D latch receiving an output of the noise control circuit and outputting a first intermediate output and a second intermediate output;
         a second comparator comparing the first intermediate output to the second intermediate output and outputting a third intermediate output;
         a second D latch receiving the third intermediate output and outputting a first control signal and a second control signal; and
         a threshold determination circuit receiving the first threshold, the second threshold, the first control signal, and the second control signal, and outputting the threshold signal.

2. The memristor matrix of claim 1, wherein the noise control circuit is a negatively hysteretic circuit.

3. The memristor matrix of claim 1, wherein the threshold determination circuit includes a first transmission gate and a second transmission gate configured as an electronic switch to switch between the first threshold and the second threshold.

4. The memristor matrix of claim 1, wherein the threshold signal output by the threshold determination circuit is a voltage between the first threshold and the second threshold.

5. The memristor matrix of claim 1, wherein the threshold comparator receives a signal of a crossbar of the crossbar array via the multiplexor and compares the received signal to the threshold signal.

6. A method, comprising:
   receiving, at a noise control circuit during a first clock cycle, a first input signal;
   comparing, at a first comparator of the noise control circuit, the first input signal to a first selected threshold;
   outputting, from the first comparator, a first output signal based on the comparing the first input signal to the first selected threshold;
   determining, at a threshold determination circuit and based in part on the output signal, a second selected threshold for a second clock cycle;
   receiving, at the noise control circuit during the second clock cycle, a second input signal;
   comparing, at the first comparator, the second input signal to the second selected threshold; and
   outputting, from the first comparator, a second output signal based on the comparing the second input signal to the second selected threshold.

7. The method of claim 6, wherein the noise control circuit is a negatively hysteretic circuit.

8. The method of claim 6, wherein the threshold determination circuit includes a first transmission gate and a second transmission gate configured as an electronic switch to switch between the first threshold and the second threshold.

9. The method of claim 6, wherein the threshold signal output by the threshold determination circuit is a voltage between the first threshold and the second threshold.

10. The method of claim 6, wherein the first input signal and the second input signals are signals of a crossbar array received via a multiplexor and the noise control circuit compares the received signals to the threshold signal.

11. The method of claim 10, wherein the crossbar array is a two dimensional array of memristors electrically cross-coupled via crossbars, and wherein the multiplexor selects a crossbar of the crossbars from which a signal is input to the noise control circuit.

12. The method of claim 10, further comprising feeding back the first output signal and the second output signal to the crossbar array.

13. A tunable hysteretic feedback circuit, comprising:
a first comparator comparing an input signal to a threshold signal and outputting a first output of the hysteretic feedback circuit;
a first D latch receiving the first output and outputting a first intermediate output and a second intermediate output;
a second comparator comparing the first intermediate output to the second intermediate output and outputting a third intermediate output;
a second D latch receiving the third intermediate output and outputting a first control signal and a second control signal; and
a threshold determination circuit receiving a first threshold, a second threshold, the first control signal, and the second control signal, and outputting the threshold signal.

14. The tunable hysteretic feedback circuit of claim 13, wherein the tunable hysteretic feedback circuit is a negatively hysteretic circuit.

15. The tunable hysteretic feedback circuit of claim 13, wherein the threshold determination circuit includes a first transmission gate and a second transmission gate configured as an electronic switch to switch between the first threshold and the second threshold.

16. The tunable hysteretic feedback circuit of claim 13, wherein the threshold signal output by the threshold determination circuit is a voltage between the first threshold and the second threshold.

17. The tunable hysteretic feedback circuit of claim 13, wherein the tunable hysteretic feedback circuit receives a signal of a crossbar array via a multiplexor and compares the received signal to the threshold signal.

18. The tunable hysteretic feedback circuit of claim 17, wherein the first output is fed back to the crossbar array.

19. The tunable hysteretic feedback circuit of claim 17, wherein crossbar array is a two dimensional array of memristors electrically cross-coupled via crossbars, and wherein the multiplexor selects a crossbar of the crossbars from which a signal is input to the tunable hysteretic feedback circuit.

* * * * *